United States Patent [19]
Bridges et al.

[11] Patent Number: 5,250,894
[45] Date of Patent: Oct. 5, 1993

[54] CURRENT SENSING SYSTEM HAVING ELECTRONIC COMPENSATION CIRCUITS FOR CONDITIONING THE OUTPUTS OF CURRENT SENSORS

[75] Inventors: Ronald P. Bridges, Heber Springs; John B. Beard, Benton, both of Ark.

[73] Assignee: Bridges Electric, Inc., Heber Springs, Ark.

[21] Appl. No.: 861,095

[22] Filed: Mar. 31, 1992

[51] Int. Cl.[5] .................................... G01R 33/06
[52] U.S. Cl. .................... 324/117 H; 324/117 R
[58] Field of Search ............ 324/127, 117 H, 117 R, 324/252, 251, 103, 107; 307/309; 338/32 H; 364/481

[56] References Cited

U.S. PATENT DOCUMENTS

| | | | |
|---|---|---|---|
| 3,418,575 | 12/1968 | Spindle | 324/117 R |
| 4,408,155 | 10/1983 | McBride | 324/107 |
| 4,539,520 | 7/1983 | McBride | 324/117 H |
| 4,801,937 | 1/1989 | Fernandes | 324/127 |
| 4,935,693 | 6/1990 | Falkowski et al. | 324/127 |

*Primary Examiner*—Vinh Nguyen
*Attorney, Agent, or Firm*—Wood, Phillips, Van Santen, Hoffman & Ertel

[57] ABSTRACT

A current sensing system includes a number of remote current sensors for measuring the magnetic field surrounding each conductor of an electrical transmission system to independently monitor the current flowing through the conductors. A generally U-shaped mounting fixture is provided for supporting the current sensors in a fixed, predetermined orientation relative to each of the conductors. An electronic compensation circuit is provided for conditioning the output of each the sensors with the output of the other of the sensors to isolate the influence of the magnetic field induced by the current flowing through only one of the conductors.

18 Claims, 3 Drawing Sheets

5,250,894

CURRENT SENSING SYSTEM HAVING ELECTRONIC COMPENSATION CIRCUITS FOR CONDITIONING THE OUTPUTS OF CURRENT SENSORS

FIELD OF THE INVENTION

This invention relates to a current sensing system for performing current monitoring and fault detection functions in a multi-phase electrical transmission system.

BACKGROUND OF THE INVENTION

Current sensors measure the magnetic field surrounding a conductor of an electrical transmission system to monitor the current flowing through the conductor. Remote current sensors are positioned at a location sufficiently distant from the conductor to prevent electrical arcing from occurring without the use of an insulating material.

Electrical fault detectors have been known in which a Hall effect transducer is used to monitor the current flowing through a conductor, as shown in U.S. Pat. No. 4,539,520 issued to McBride on Sep. 3, 1985. A Hall effect transducer is positioned between a pair of tapered pole pieces having a wide cross-sectional area at one end and a small cross-sectional area at the opposite end, adjacent to the transducer. The tapered pole pieces concentrate low density magnetic flux in the air into a high density magnetic flux focused onto the transducer enabling the detection of a magnetic field from a distance which is greater than the electrical arcing distance. Typically, the sensor is positioned such that a flux-sensitive axis defined by the pole pieces is aligned tangentially with the magnetic field to achieve a sufficient concentration of magnetic flux on the transducer. The influence of the magnetic field is greatest when the axis of the sensor is tangential to the lines of magnetic flux and minimal when the axis perpendicular.

A problem arises with the prior art current sensing devices in applications wherein it is desired to independently monitor a number of electrical currents based on analysis of measurements taken in a composite magnetic field having components induced by each of currents. Because measurements of the composite magnetic field represent contributions of each of the currents, it is difficult to make an accurate determination of any one of the currents without knowing the relationship between the contributions. This problem is particularly troublesome in multi-phase power transmission systems.

In multi-phase electrical power systems, each of the different phases is transmitted by a different conductor, with the conductors of a typical three phase electrical transmission system being arranged in a parallel, triangular configuration. The current transmitted through each of the conductors induces a generally cylindrical magnetic field, which is superposed with the fields of the adjacent conductors. By aligning the sensitive axis of the current sensor tangential to the magnetic field associated with a particular current, so as to advantageously achieve the above noted necessary concentration of magnetic flux on the Hall effect transducer, the sensor necessarily is positioned so that it is influenced by the magnetic fields of the other two conductors. Accordingly, the measurement obtained by the current sensor is not indicative of only a single current but, rather, represents a composite of each of the currents.

SUMMARY OF THE INVENTION

An object, therefore, of the invention is to provide a new and improved current sensing system of the character described.

In accordance with the present invention, a remote current sensing system is provided in which a number of electrical currents can be independently monitored based upon measurement and analysis of a composite magnetic field.

An exemplary current sensing system includes a number of remote current sensors for measuring the magnetic field surrounding each conductor of an electrical transmission system to monitor the current flowing through the conductor. In a three-phase electrical transmission system, distinct phase components are transmitted through independent conductors arranged in a parallel, triangular configuration. The current sensors are mounted in a fixed, predetermined orientation relative to a respective one of the conductors whereby the magnetic field components contributed by each of the phases can be independently monitored.

Each remote current sensor includes a Hall effect transducer for measuring the magnetic field surrounding an associated conductor. The transducer is positioned between a pair of tapered pole pieces having a wide cross-sectional area at one end and a small cross-sectional area at the opposite end, adjacent to the transducer. The tapered pole pieces concentrate low density magnetic flux in the air into a high density magnetic flux focused onto the transducer enabling the detection of a magnetic field from a distance which is greater than the electrical arcing distance.

In order to maintain the fixed, predetermined relative orientation of the current sensors, a generally U-shaped mounting fixture is provided and has a pair of substantially parallel legs separated by a transverse link. A current sensor is rigidly mounted to each of the legs and the transverse links, and the fixture is disposed such that each of the sensors is immersed in the composite magnetic field.

Specifically, a first remote current sensor is positioned so that its sensitive axis is perpendicular to the plane of the first and third conductors, and is tangent to the magnetic field surrounding two of the conductors. A second remote current sensor is positioned so that its sensitive axis is parallel to the plane of the first and third conductors. A third remote current sensor is positioned so that its sensitive axis is perpendicular to the plane of the first and third conductors, and is tangent to the magnetic field surrounding two of the conductors.

So positioned, the current sensors measure the magnetic field due to the current flowing through all of the conductors. The strength of the magnetic field at the sensor location is proportional to "i/d" where "i" is the current flowing through the conductor and "d" is the distance between the conductor and the point of measurement, and the amount of magnetic flux focused on the transducer also depends on the angle between the axis of the sensor and the lines of magnetic flux. Because the fixture maintains the sensors in a fixed geometry with respect to the three conductors, measurement of the magnetic field at three locations, as by the three current sensors, permits compensation of each measurement to cancel the influences of the other two currents and monitor the value of a single current independently of the others.

An electronic compensation circuit is provided for conditioning the output of any one of the sensors with the output of the other sensors such that the influence of the magnetic field induced by the other currents is eliminated from the one output signal. The output signals generated by the other sensors are electronically scaled in proportion to the distance between the nonassociated conductors and the one sensor such that the conditioned output signal is proportional to the magnetic field induced by the current flowing through only the conductor associated with the one sensor.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects advantages, can be understood best by consideration of the following description taken in conjunction with the accompanying drawings, in which like reference numerals identify like elements in the figures and in which:

DESCRIPTION OF THE PREFERRED EMBODIMENT

Figure 1:
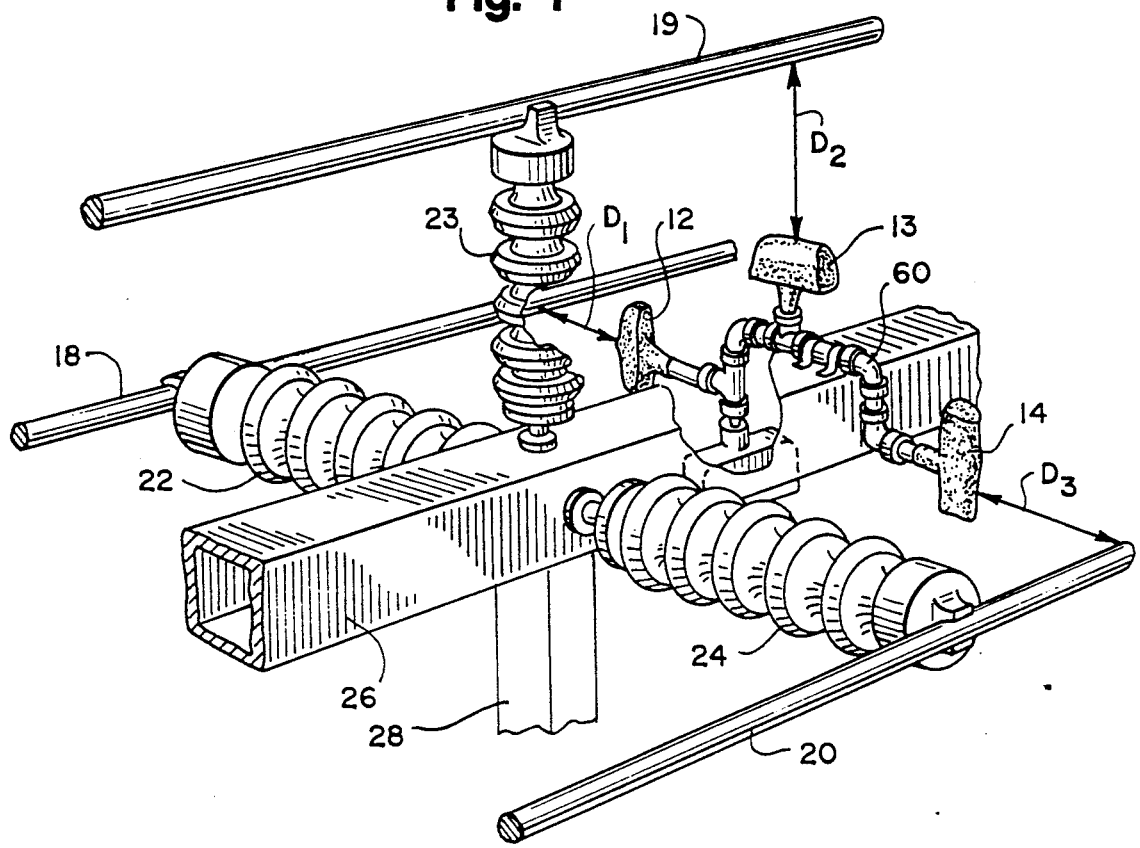
FIG. 1 illustrates the positioning of the current sensing system of the present invention with respect to a three-phase electrical transmission system

The current sensing system of the present invention is generally designated 10 in FIG. 1 and utilizes three remote current sensors 12, 13 and 14 to measure the magnetic field associated with a three-phase electrical transmission system, shown generally at 16. Three-phase electrical transmission system 16 has three overhead conductors 18, 19 and 20 for transferring independent phases of high voltage electrical power and which are arranged in a substantially parallel, triangular configuration. Each of overhead conductors 18, 19 and 20 is secured to a respective insulator 22, 23, and 24 mounted on a box-like housing 26 which is supported by a pole 28.

Remote current sensors 12, 13 and 14 generally are identical devices and will, therefore, be described with reference only to remote current sensor 12. It will be fully understood, however, that the following discussion of the construction of remote current sensor 12 applies in an analogous manner to remote current sensors 13 and 14.

Figure 2:
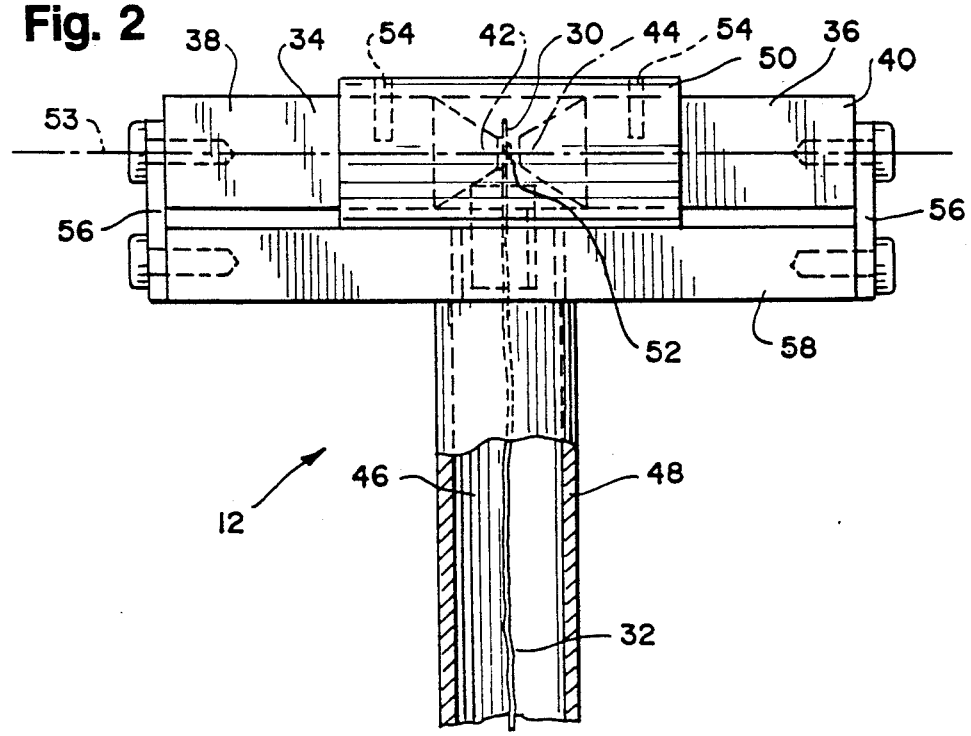
FIG. 2 is a side elevational view of a remote current sensor used in the current sensing system of the present invention.

Referring also to FIG. 2, remote current sensor 12 includes a Hall effect transducer 30 for measuring the magnetic field surrounding overhead conductors 18, 19 and 20. Hall effect transducer 30 should have high sensitivity, linearity, repeatability, and stability over a wide range of ambient temperatures. A Honeywell 92SS12-2 transducer is suitable. The magnetic field surrounding each conductor is proportional to "i/d" where "i" is the current flowing through the conductor and "d" is the distance between the conductor and the point of measurement. The output of Hall effect transducer 30 is a voltage proportional to the magnetic field sensed and thus proportional to the current flowing through the conductors. The output voltage is provided by transducer 30 on lines 32 to a current monitor circuit for such purposes as identifying and locating fault currents, controlling the operation of circuit breakers, and accumulating operational data.

In order to remotely detect low density magnetic flux, Hall effect transducer 30 is positioned between a pair of pole pieces 34 and 36, made of a low hysteresis ferro-magnetic material. Pole pieces 34 and 36 are tapered, having a wide cross-sectional area at respective ends 38 and 40 and a small cross-sectional area at the opposite ends 42 and 44 adjacent to the transducer 30. Wide pole piece ends 38 and 40 collect low density magnetic flux in the air and focus the flux into a concentrated high density magnetic field between the small pole piece ends 42 and 44. The resulting magnetic field focused onto the Hall effect transducer is proportional to the magnetic field in the air but has a much higher density to enable the detection of the field from a remote location.

Hall effect transducer 30 is mounted in a flexible silastic potting material 46 through the inner wall of a transducer sleeve 48. A sleeve 50 rigidly supports pole pieces 34 and 36 and transducer sleeve 48 so that the magnetic field sensed is focused directly onto the sensitive area 52 of transducer 30. The arrangement of the pole pieces thus defines a sensitive axis 53 along which an optimal concentration of magnetic flux density may be measured.

Sleeve 50 is secure to the pole pieces by drive pins 54 and is made of fiberglass or other insulating material in order to eliminate eddy currents which would arise if the sleeve were made of a conducting material. Eddy currents will produce an erroneous transducer output so that it is essential that such currents be eliminated. Remote current sensor 12 is clamped between a pair of opposite clips 56 and held thereby against a metal bar 58, with a portion of sleeve 50 sandwiched between pole pieces 34 and 36 and bar 58.

Each remote current sensor 12, 13 and 14 is located at a distance from a respective conductor 18, 19, and 20 which is greater than the electrical arcing distance so as to allow use of the air gap between the conductor and the remote current sensor as insulation. For a 15,000 volt transmission line, each remote current sensor is located approximately 20" from a respective conductor, and for a 138,000 volt line each sensor is located approximately 60" from the respective conductors. These distances are sufficiently remote from the conductors to prevent electrical arcing from occurring without the use of an insulation material.

Figure 3:
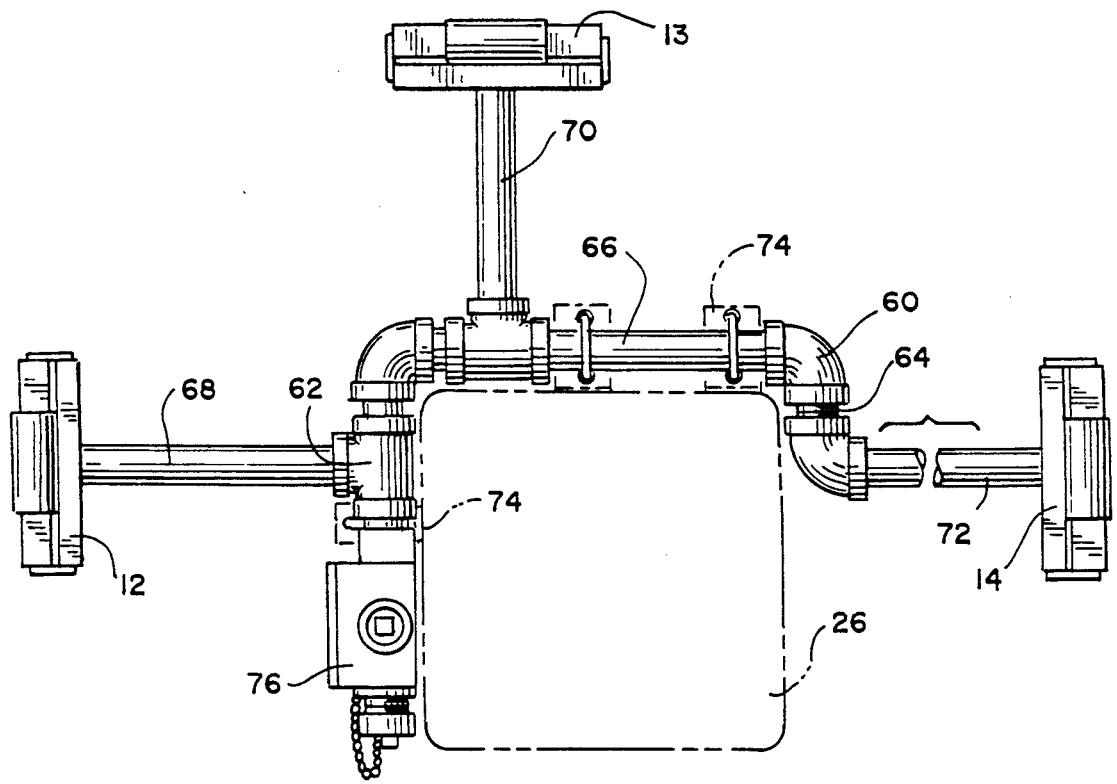
FIG. 3 is a top plan view of the current sensing system illustrated in claim 1.

Particularly, a generally U-shaped mounting fixture 60 (FIG. 3) is provided for positioning remote current sensors 12-14 in a fixed, predetermined relative orientation with respect to housing 26 and overhead conductors 18-20. As shown also in FIG. 1, mounting fixture 60 has a generally tubular construction with a pair of substantially parallel legs 62 and 64 separated by a transverse leg 66. Remote current sensor 12 is connected to leg 62 by means of a laterally extending connector 68 and is maintained at a distance D1 from conductor 18. Remote current sensor 13 is connected to leg 66 by means of a laterally extending connector 70 and is maintained at a distance D2 from conductor 19. Remote current sensor 14 is connected to leg 64 by means of a laterally extending connector 72 and is maintained at a distance D3 from conductor 20. Distances D1, D2 and D3 are prescribed such that each of the current sensors 12, 13 and 14 is generally equidistant from a respective overhead conductor 18, 19 and 20.

Specifically, remote current sensor 12 is positioned so that its sensitive axis is perpendicular to the plane of the overhead conductors 18 and 20, and is tangent to the magnetic fields surrounding two of the conductors. Remote current sensor 13 is positioned so that its sensitive axis is parallel to the plane containing overhead conductors 18 and 20, and is tangent to the magnetic field surrounding conductor 19. Remote current sensor 14 is positioned so that its sensitive axis is perpendicular to the plane containing overhead conductors 18 and 20, and is tangent to the magnetic field surrounding two of the conductors.

Clamp fixtures 74 rigidly secure mounting fixture 60 to housing 26. A junction box 76 is mounted to a distal end of leg 62 and receives wires 32 extending from each current sensor through the tubular mounting fixture 60.

Although each remote current sensor 12, 13 and 14 predominantly measures the magnetic field surrounding only the closest, respective conductor 18, 19, and 20, the sensors also are affected by the magnetic fields due to the currents flowing through the non-respective conductors. That is, because current sensor 12 is sensitive to the magnetic fields due to the phase components transmitted through conductors 19 and 20, as well as the magnetic field due to the phase component transmitted through conductor 18, measurements taken by current sensor 12 are not representative of only the current flowing through conductor 18. Similarly, current sensors 13 and 14 are affected by the magnetic fields due to the currents flowing through each of the conductors.

The affects of the currents flowing through the other conductors on a particular remote current sensor will be canceled with a compensating current monitoring circuit discussed in detail below.

Figure 4:
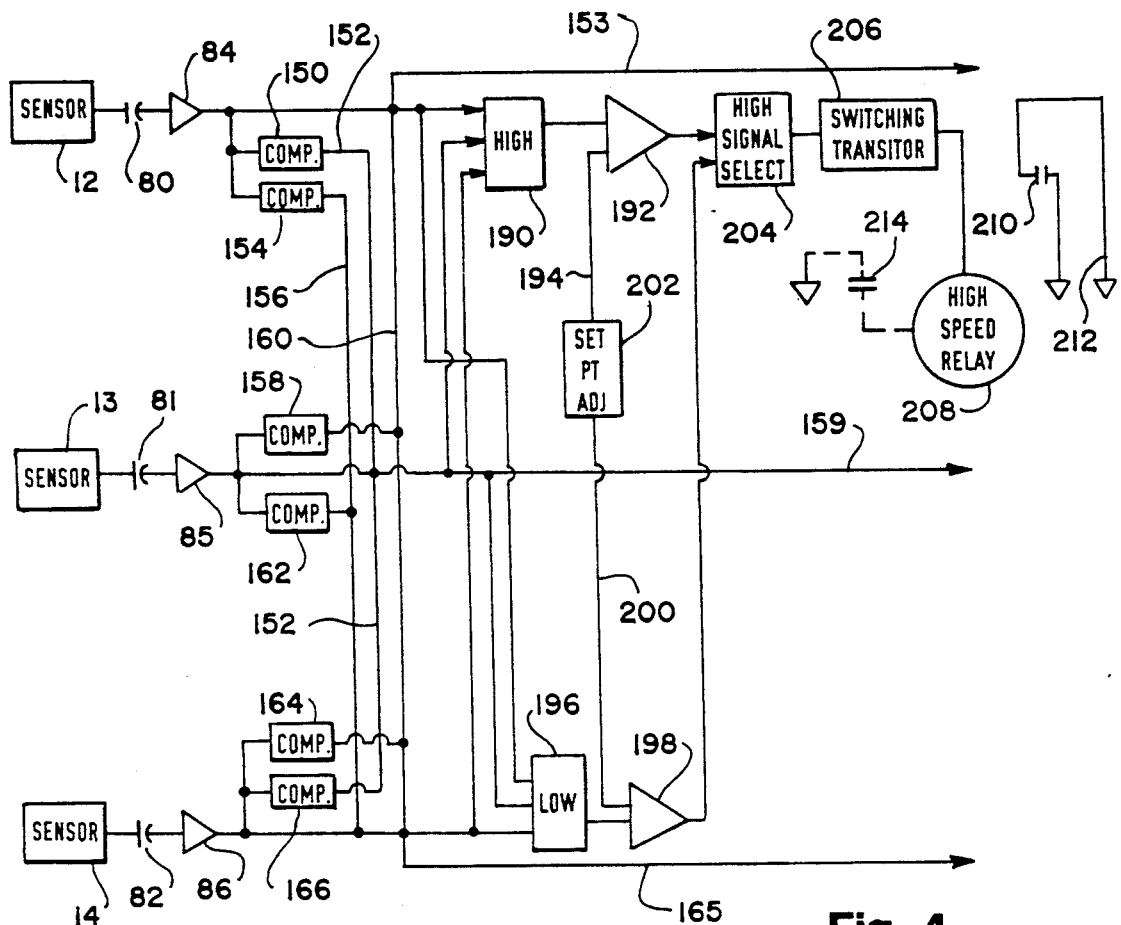
FIG. 4 is a block diagram of the current monitor circuit.
Figure 5:
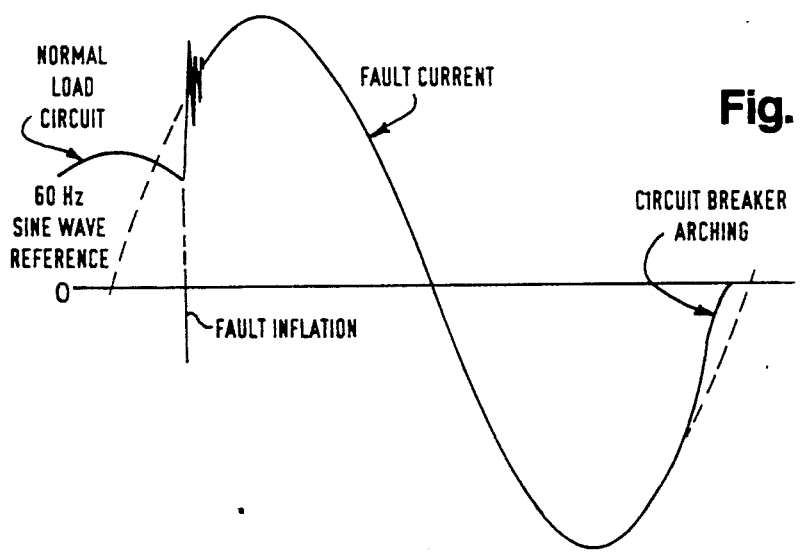
FIG. 5 is a graphical illustration of a fault current.

A block diagram of the current monitoring circuit is shown in FIG. 4 having three remote current sensors 12, 13 and 14. In order to provide an accurate measurement of the magnetic fields due to the currents flowing through the conductors of an electrical transmission system, the affects of the earth's magnetic field must be eliminated from the output signals of the remote current sensors. The earth's magnetic field is relatively constant as opposed to the magnetic field surrounding a conductor of an electrical transmission system which varies at a 60 cycle rate. Capacitors 80, 81 and 82, respectively coupled to the respective outputs of sensors 12, 13 and 14, effectively eliminate the D.C. component of the sensor signal attributable to a constant magnetic field such as the earth's field. Only the A.C. components of the sensor signals are passed by capacitors 80, 81 and 82 to respective amplifiers 84, 85 and 86 so that the amplified signals accurately reflect the magnetic field due solely to the current flowing through the conductors.

The outputs of amplifiers 84, 85 and 86 are the amplified A.C. sensor voltage superimposed upon a steady state D.C. voltage. Depending upon the value at which the steady state D.C. voltage of the amplifier is set, the negative half-cycle of the amplified sensor signal may have a positive value. Therefore, a reference to a negative half-cycle of the amplified sensor signal connotes a negative half-cycle with respect to the steady state D.C. voltage of the amplifier output.

In order to eliminate the influence of the nonrelated magnetic fields from each of the respective sensor outputs, compensation circuitry is provided to permit the adjustable attenuation of each of the other two sensor outputs from a single output.

As shown schematically in FIG. 4, a variable compensator 150 is provided on a line 152 which transmits the output of remote current sensor 13. Adjustment of the gain of compensator 150 permits the selective attenuation of the contribution of output from current sensor 13 to the output of current sensor 12 which is carried by a line 153. Similarly, a variable compensator 154 is provided on a line 156 which transmits the output of remote current sensor 14. Adjustment of the gain of compensator 154 permits the selective attenuation of the contribution of output from current sensor 14 to the signal carried by line 153. Appropriate adjustment of the variable compensators 150 and 154 thereby permits the elimination of any influences of the magnetic field sensed with sensors 13 and 14 on the output signal of remote current sensor 12, such that the signal carried by line 153 is proportional to the current flowing only through conduct 18.

A variable compensator 158 is provided on a line 160 which transmits the output of remote current sensor 12. Adjustment of the gain of compensator 158 permits the selective attenuation of the contribution of output from current sensor 12 to the output of current sensor 13 which is carried by a line 159. Similarly, a variable compensator 162 is provided on line 156. Adjustment of the gain of compensator 162 permits the selective attenuation of the contribution of output form current sensor 14 to the signal carried by line 202. Appropriate adjustment of the variable compensators 158 and 162 thereby permits the elimination of any influences of current sensors 12 and 14 on the output signal of remote current sensor 13, such that the signal carried by line 159 is proportional to the current flowing only through conductor 19.

A variable compensator 164 is provided on line 160. Adjustment of the gain of compensator 164 permits the selective attenuation of the contribution of output from current sensor 12 to the output of sensor 14 which is carried by a line 165. Similarly, a variable compensator 166 is provided on line 152. Adjustment of the gain 166 permits the selective attenuation of the contribution of output from current sensor 13 to the signal carried by line 165. Appropriate adjustment of variable compensators 164 and 166 thereby permits the elimination of any influences of current sensors 12 and 13 on the output signal of remote current sensor 14, such that the signal carried by line 165 is proportional to the current flowing only through conductor 20.

Thus, the signal carried by line 153 is proportional solely to the current flowing through overhead conductor 18, with the influence of current flowing through adjacent conductors 19 and 20 effectively eliminated by the aforesaid compensation circuitry. Similarly, the signal carried by line 159 is proportional solely to the current flowing through overhead conductor 19, with the influence of current flowing through adjacent conductors 18 and 20 effectively eliminated, and the signal carried by line 165 being proportional solely to the current flowing through overhead conductor 20, with the influence of current flowing through adjacent conductors 18 and 19 effectively eliminated.

The initial gain settings of variable compensators 150, 154, 158, 162, and 164, 166 can be selected in advance due to the predetermined relative orientation of the remote current sensors 12, 13 and 14 achieved with mounting fixture 60. Because the strength of the magnetic fields induced by the currents flowing through each of the overhead conductors 18, 19 and 20 is proportional to the aforesaid value of "i/d", mounting fixture 60 is effective to prescribe the value of "d", i.e., the distance between each current sensor and the respective overhead conductor. As a result, the gain values required in each compensator can be determined and preset with a high degree of accuracy.

A primary application of the current monitoring circuit is therefore served by providing an accurate electrical signal representative of the phase components transmitted through overhead conductors 18, 19 and 20, independent of the influencing effects of the combination of magnetic fields. Line 153 can be monitored to continuously assess the magnitude of current flowing through conductor 18, line 159 can be monitored to continuously assess the magnitude of current flowing through conductor 19, and line 165 can be monitored to continuously assess the magnitude of current flowing through conductor 20.

A second application of the current monitoring circuit is the identification and location of a fault current. A fault current may result from a short circuit between a conductor and ground or between any two or all three conductors. For the discrete fault detection output, the board takes the channel signals and compares each one to a set point voltage which is adjustable using a board mounted potentiometer and a standard hand held potentiometer. A chart is used to select the set point voltage that corresponds to a given fault current level. If the channel signal exceeds the set point voltage and appropriate requirements are met (see below), a high speed latching relay is activated, indicating fault current. There are three voltage relays, so the phase or phases that had fault current can be identified. Contacts on the relays are reset by a contact closure from the interface device across one set of board mounted terminals.

The unit has an on-board power supply that is connected to a 120 VAC source through a transformer. The board has power retention circuitry to allow enough time for the unit to sense fault current and latch the corresponding relay after loss of the 120 VAC source.

As indicated above, in order to indicate a fault, a channel signal must exceed the set point voltage and pass certain other criteria. The criteria are built into the unit to prevent false or inaccurate fault information. The unit normally responds within one quarter cycle of either a positive or negative peak. A thirty-cycle delay time on power-up is built into the unit to prevent false information when the power is initially supplied to the unit. Not only does the delay allow the unit to reach steady state without triggering a fault, but also allows the unit to ignore inrush currents which develop during breaker operations. For example, with the switch closed a fault is indicated on "A" phase. When a station breaker opens, voltage to unit is lost. When the breaker closes, inrush current might trip the "B" and "C" phases, thereby giving an incorrect indication that there is a three phase fault.

Additional triggering criteria built into the unit is that a fault must be present for two consecutive peaks (either two positive or two negative) for a fault to be indicated. Such a criteria defeats the unit's normal quarter-cycle response time, which is thus extended to approximate 1.5 cycles, and prevents false indication from upstream faults on lines with downstream motor loads.

Due to the fixed, predetermined triangular arrangement of the current sensors achieved with mounting fixture 60, a single set point may be used for comparison to any of the amplified sensor signal outputs. That is, since sensors 12, 13 and 14 are positioned equidistant from the respective overhead conductors 18, 19 and 20, the outputs of sensors 12, 13 and 14 will be of the same order of magnitude. Fault currents are of a sufficiently higher magnitude than are load currents so that a sensor output corresponding to a load current may be distinguished from a sensor output corresponding to a fault current using a single set point for comparison with the outputs from either of the sensors 12, 13 or 14.

A high signal selector 190 selects the higher positive amplified signal from the amplifiers 84, 85, 86 and passes it to a comparator 192. A low signal selector 196 selects the least positive amplified sensor signal to be passed to a comparator 198.

A set point adjustment 202 is adjusted so that the maximum output from the currents sensors corresponding to a load current flowing through the respective conductors will be ignored by comparators 192 and 198, but the minimum output from the sensors corresponding to a line-to ground fault on any of the conductors will be detected.

When either of the outputs of comparators 192 or lo 198 goes high indicating a fault, a high signal selector 204 actuates a switching transistor 206. When turned on, switching transistor 206 conducts, drawing current through a high speed relay 208, thereby setting the relay. When relay 208 is set, its contacts 210 close to provide a fault indication signal on lines 212. The fault indication signal may be transmitted on lines 212 to a supervising station which monitors the electrical transmission system. at the supervising station, the fault indication signal can be used to locate the fault or it can be used to accumulate operational data. The fault indication signal provided on line 212 may also be used to actuate circuit breakers in order to protect the equipment of the electrical transmission from damaging fault currents.

In order to reset the relay 208 after a fault has been identified, a relay contact 214 is closed causing current to flow through the relay in a direction opposite to the direction of current which sets the relay.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A current sensing system for independently monitoring the current flowing through a number of conductors, the current sensing system comprising:
   a plurality of current sensors each associated with one of the conductors for providing an output signal proportional to the effect of a magnetic field;
   means for supporting each sensor in proximity to its associated conductor and in a composite magnetic field induced by the current flowing through each conductor such that each sensor is subjected to magnetic fields induced by current flowing through the associated conductor and the other conductors; and means associated with each sensor for modifying the output signal of the sensor such that the output signal is proportional to the current flowing through only the associated conductor.

2. The current sensing system of claim 1 in which the means for supporting the sensors comprises a fixture adapted to hold the sensors at a predetermined distance from the associated conductors.

3. The current sensing system of claim 2 in which the means for modifying the output signal of each sensor comprises electronic circuit means for conditioning the output of one of the sensors with the output of the other of the sensors such that the influence of the magnetic field induced by the current flowing through the conductors associated with the other sensors is eliminated from the output signal of the one sensor and the output signal of the one sensor is thereby proportional to the magnetic field induced by the current flowing through only the conductor associated with the one sensor.

4. The current sensing system of claim 1 in which a current sensor comprises a pair of tapered pole pieces with a magnetic-field measuring transducer positioned therebetween, each of the pole piece being of ferromagnetic material and having a wide cross sectional area at one end to pick up a low density magnetic flux in the air and a small cross sectional area at the opposite end adjacent to the transducer to concentrate the low density magnetic flux into a high density magnetic flux focused on the transducer.

5. The current sensing system of claim 4 in which the transducer and pole pieces are positioned at a location removed from the conductor greater than the electric arcing distance for the voltage at which the conductor is normally operated.

6. The current sensing system of claim 1 in which a current sensor comprises a Hall effect transducer for measuring the magnetic field.

7. The current sensing system of claim 1 in which each of the current sensors has a sensitive axis which is tangential to the magnetic field induced by the current flowing through the associated conductors.

8. The current sensing system of claim 7 in which each sensor has an associated sensitive axis, the sensors being disposed such that the sensitive axis of each current sensor is substantially coplanar.

9. The current sensing system of claim 8 in which at least one of the conductors is substantially perpendicular to the plane in which the sensitive axes of each current sensor lie.

10. The current sensing system of claim 1 having three current sensors and three associated conductors.

11. The current sensing system of claim 10 in which the means for modifying the output signal of each sensor comprises electronic circuit means for conditioning the output of one of the sensors with the output of the other of the sensors, the electronic circuit means including means for scaling the output from the other of the sensors in proportion to the distance between conductors associated with the other sensors and the one of the sensors such that the influence of the magnetic field induced by the current flowing through the conductors associated with the other sensors is eliminated from the output signal of the one sensor and the output signal from the one sensor is thereby proportional to the magnetic field induced by the current flowing through only the conductor associated with the one sensor.

12. In a multi-phase electrical transmission system wherein separate phase components of an electrical current flow through associated electrical conductors, a current sensing system for independently monitoring the current flowing through each of the conductors, the current sensing system to be positioned in a composite magnetic field including magnetic field components which are induced by current phase components flowing through each of the associated conductors, the current sensing system comprising:

a plurality of current sensors associated one each with the conductors for providing an output signal proportional to the effect of the composite magnetic field, each sensor having a sensitive axis tangent to the magnetic field component induce by current flowing through an associated conductor; and means for supporting each of the current sensors in a predetermined relationship with respect to each of the conductors such that each sensor is subjected to the magnetic field induced by current flowing through the associated conductor and the nonassociated conductors; and means associated with each sensor for modifying the output signal of the sensor such that the output signal is proportional to the current flowing through only the associated conductor.

13. The current sensing system of claim 12 in which the support means comprises a generally U-shaped conduit having a pair of spaced apart parallel portions connected by a transverse central portion.

14. The current sensing system of claim 13 having three sensors with a first one of the sensors being mounted on a first one of the pair of parallel portions, a second one of the sensors being mounted on the second one of the pair of parallel portions, and the third sensor being mounted on the central conduit portion.

15. The current sensing system of claim 14 in which one of the pair of spaced apart parallel portions mounts a hollow junction box for receiving wires connectable with each of the sensors and extendable through the conduit.

16. A current sensing system for independently monitoring the separate phase components transmitted in a three phase transmission line having first, second and third parallel conductors arranged in a triangular configuration comprising:

a first sensor associated with a first one of the three phase components;

a second sensor associated with a second one of the three phase components;

a third sensor associated with a third one of the three phase components, each of the first sensor and the second sensor and the third sensor measuring the effect of a composite magnetic field induced by the three phase components current and providing an output signal in proportional response thereto;

fixture means for positioning each of the sensors in the composite magnetic field in a predetermined spaced orientation relative to the conductors; and electronic circuit means for conditioning the output signal of one of the sensors with the output signals of the other of the sensors whereby the effects of individual magnetic fields surrounding each of the conductors associated with the other sensors can be compensated for such that each sensor is effective to generate a signal representative of the phase component flowing through only the conductor associated with the one sensor.

17. A method for independently monitoring the current flowing through each of a number of electrical conductors comprising the steps of:
- positioning a number of sensors in a composite magnetic field induced by currents flowing through the conductors, each of the conductors being positioned in a predetermined relationship with an associated one of the sensors,
- generating an output signal proportional to the flux density of the composite magnetic field sensed by each of the sensors;
- conditioning the output signal of each of the sensors with the output of the other of the sensors such that the influence of the magnetic field induced by the current flowing through the conductors associated with the other of the sensors is eliminated from the output signal and the output signal is thereby proportional to the magnetic field induced by the current flowing through only the associated conductor.

18. The method of claim 17 including the step of scaling the output from the other of the sensors in proportion to the distance between the conductors associated with the other of the sensors and the one of the sensors such that the influence of the magnetic field induced by the current flowing through the conductors associated with the other of the sensors is eliminated from the output signal and the output signal is thereby proportional to the magnetic field induced by the current flowing through only the associated conductor.

* * * * *